(12) United States Patent
Pasanen et al.

(10) Patent No.: US 10,177,314 B2
(45) Date of Patent: Jan. 8, 2019

(54) APPARATUS, METHODS AND DEVICES

(75) Inventors: Pirjo Pasanen, Helsinki (FI); Vladimir Ermolov, Espoo (FI)

(73) Assignee: Nokia Technologies Oy, Espoo (FI)

( * ) Notice: Subject to any disclaimer, the term of this patent is extended or adjusted under 35 U.S.C. 154(b) by 1346 days.

(21) Appl. No.: 12/630,206

(22) Filed: Dec. 3, 2009

(65) Prior Publication Data

US 2011/0132438 A1   Jun. 9, 2011

(51) Int. Cl.
*B82Y 10/00* (2011.01)
*B82Y 20/00* (2011.01)
*B82Y 30/00* (2011.01)
*B82Y 40/00* (2011.01)
*C01B 32/15* (2017.01)
*H01L 51/00* (2006.01)

(52) U.S. Cl.
CPC .......... *H01L 51/0047* (2013.01); *B82Y 10/00* (2013.01); *B82Y 20/00* (2013.01); *B82Y 30/00* (2013.01); *B82Y 40/00* (2013.01); *C01B 32/15* (2017.08); *H01L 51/0049* (2013.01); *Y02E 10/549* (2013.01); *Y02P 70/521* (2015.11)

(58) Field of Classification Search
CPC ......... B82Y 10/00; B82Y 30/00; B82Y 40/00; B82Y 99/00; Y02E 10/549; H01L 51/0047; H01L 51/0049; C01B 31/0206
USPC ......... 136/244, 252, 263; 977/700, 734, 842
See application file for complete search history.

(56) References Cited

U.S. PATENT DOCUMENTS

| 6,198,091 B1* | 3/2001 | Forrest et al. ............. 250/214.1 |
| 6,603,139 B1* | 8/2003 | Tessler ................... B82Y 10/00 |
| | | 257/290 |
| 2006/0000505 A1* | 1/2006 | Hayashi et al. ............... 136/263 |
| 2009/0101953 A1 | 4/2009 | Hayashi et al. ............... 257/292 |
| 2009/0205713 A1 | 8/2009 | Mitra et al. ................... 136/263 |

FOREIGN PATENT DOCUMENTS

| JP | 2008063390 A * | 3/2008 |
| JP | 2009-234866 A | 10/2009 |
| WO | WO 2007/057501 A1 | 5/2007 |
| WO | WO 2009/056686 A1 | 5/2009 |
| WO | WO 2009141595 A2 | 11/2009 |
| WO | WO 2009/156596 A1 | 12/2009 |

OTHER PUBLICATIONS

Satoh et al. "Metal-Assembling dendrimers with a triarylamine core and their application to a dye-sensitized solar cell". J. Am. Chem. Soc. 2005, 127, 13030-13038.*
English machine translation of JP2008-063390A.*
Hasobe et al. "Supramolecular photovoltaic cells based on composite molecular nanoclusters: Dendritic porphyrin and C60, porphyrin dimer and C60, and porphyrin-C60 dyad". J. Phys. Chem. B 2004, 108, 12865-12872.*

(Continued)

*Primary Examiner* — Lindsey A Bernier
(74) *Attorney, Agent, or Firm* — Harrington & Smith

(57) ABSTRACT

Apparatus including one or more carbon nanotubes; one or more fullerenes directly covalently bonded to the one or more carbon nanotubes; and one or more photoactive molecules bonded to the one or more fullerenes.

13 Claims, 7 Drawing Sheets

(56) References Cited

OTHER PUBLICATIONS

Imahori, et al, "Porphyrin and Fullerene-based photovoltaic Devices", Journal of Photochemistry and Photobiology A: Chemistry, www.elsevier.com/locate/jphotochem, (2004).

Zhou, et al, "Color Detection Using Chromophoro-Nanotube Hybrid Devices", (2009) vol. 9, No. 3, pp. 1028-1033.

Liu, "Enhanced Performance of Bulk Heterojunction Solar Cells Fabricated by Polymer: Fullerance: Carbon-Nanotube Composites", pp. 233-236 (2008).

Guldi, "Fullerene-porphyrin Architectures; Photosynthetic Antenna and Reaction Center Models", Chem. Soc. Rev., 2002, The Royal Society of Chemistry 2002; pp. 22-36.

Giordani, et al, Multifunctional Hybrid Materials Composed of [60] Fullerene-based Functionalized-single-walled Carbon Nanotubes, (2009), pp. 578-588.

Kim, et al, "Electroluminescence in Polymer-fullerene Photovoltaic Cells", http://apl.aip.org/apl/copyright.jsp, Applied Physics Letter 86, 183502 (2005), 3 pages.

Nasibulin, et al, "A Novel Hybrid Carbon Material", (2007) pp. 156-161.

Li, et al, "A Fullerene-Single Wall Carbon Nanotube Complex for Polymer Bulk Heterojunction Photovoltaic Cells", The Royal Society of Chemistry (2007), pp. 2406-2411.

Zavodchikova, et al, "Carbon Nanotube Thin Film Transistors Based on Aerosol Methods", (2009), pp. 1-10.

Nasibulin et al., "Investigations of Nanobud Formation", Chemical PhysicsLetters 446, (2007), (pp. 109-114).

Meng, et al., "First Principles Study of a Hybrid Carbon Material: Imperfect Fullerenes Covalently Bonded to Defective Single-Walled Carbon Nonotubes", The American Physical Society, (2008), (pp. 033415-1 through 033145-4).

Kalita, et al., "Fullerene (C60) Decoration in Oxygen Plasma Treated Multiwalled Carbon Nanotubes for Photovoltaic Application", Applied Physics Letters 92, (2008), (pp. 063508-1 through 063508-3).

Wu, et al., "Synthesis and Characterization of a Grapevine Nanostructure Consisting of Single-Walled Carbon Nanotubes with Covalently Attached [60] Fullerene Balls", InterScience, (2008), (pp. 5981-5987).

Li, et al., "A Fullerene-single Wall Carbon Nanotube Complex for Polymer Bulk Heterojunction Photovoltaic Cells", Journal of Materials Chemistry, (2007), (pp. 2406-2411).

Tomokazu Umeyama, et al.; Clusterization, Electrophoretic Deposition, and Fullerene-Functionalised Carbon Nanotube Composites,: Chemistry—A European Journal, Wiley—V C H Verlag GMBH & Co. KGAA, Weinham, DE, vol. 14, No. 16, May 29, 2008, pp. 4875-4885.

\* cited by examiner

APPARATUS, METHODS AND DEVICES

FIELD OF THE INVENTION

Embodiments of the present invention relate to apparatus, methods and devices. In particular, they relate to apparatus, methods and devices in a portable communication device.

BACKGROUND TO THE INVENTION

Devices such as optical sensors and photovoltaic devices usually include one or more photoactive layers for detecting photons. The one or more photoactive layers may include a polymer that is configured to absorb photons and convert them into an electrical signal. However, such photoactive layers are usually relatively inefficient at converting received photons into an electrical signal and this may render the device unsuitable for various different applications. For example, where a photovoltaic device is located in a country that does not receive much sunshine (due to cloud cover for example), the inefficiency of the one or more photoactive layers may result in the generation of insufficient electrical energy for practical purposes.

Therefore, it would be desirable to provide an alternative device.

BRIEF DESCRIPTION OF VARIOUS EMBODIMENTS OF THE INVENTION

According to various, but not necessarily all, embodiments of the invention, there is provided apparatus comprising: one or more carbon nanotubes; one or more fullerenes directly covalently bonded to the one or more carbon nanotubes; and one or more photoactive molecules bonded to the one or more fullerenes.

The apparatus may be for photoelectric conversion.

The apparatus may further comprise one or more $sp^2$ bonds directly between a carbon atom of the one or more fullerenes and a carbon atom of the carbon nanotube.

The one or more photoactive molecules may be covalently bonded to the one or more fullerenes.

The one or more photoactive molecules may be configured such that reception of a photon causes an electron to move to the one or more fullerenes. The one or more photoactive molecules may be configured such that reception of a photon causes the one or more photoactive molecules to change configuration.

The apparatus may further comprise molecules configured to provide electrons to the one or more photoactive molecules.

According to various, but not necessarily all, embodiments of the invention there is provided a device comprising: a first electrode and a second electrode; a photoactive member including apparatus as described in any of the preceding paragraphs, the photoactive member being coupled to the first electrode and to the second electrode.

The first electrode and/or the second electrode may comprise one or more nanotubes and one or more fullerenes directly covalently bonded to the one or more carbon nanotubes.

The density of carbon nanotubes in the photoactive member may be greater than the percolation threshold of semiconducting nanotubes and less than the percolation threshold of metallic carbon nanotubes, or the density of carbon nanotubes in the photoactive member may be greater than the percolation threshold of metallic carbon nanotubes. The device may be operable as a photo sensor.

The density of carbon nanotubes in the photoactive member may be less than the percolation threshold of semiconducting nanotubes, or may be greater than the percolation threshold of semiconducting nanotubes and less than the percolation threshold of metallic carbon nanotubes, or may be greater than the percolation threshold of metallic carbon nanotubes. The device may be operable as a photovoltaic cell.

The device may further comprise an electrical energy storage device coupled to the first and second electrodes and may be configured to receive electrical energy from the photoactive member.

According to various, but not necessarily all, embodiments of the invention there is provided an imaging device comprising a plurality of devices as described in any of the preceding paragraphs.

A first portion of the photoactive members may be configured to detect photons having frequencies in a first frequency band, and a second portion of the photoactive members may be configured to detect photons having frequencies in a second frequency band.

Each photoactive member may be configured to detect photons having frequencies in a frequency band. The imaging device may further comprise one or more filters configured to filter photons having frequencies in frequency bands that are a subset of the frequency band.

The first and second electrodes may be configured to receive electrical energy and provide the electrical energy to the photoactive member, and wherein the device is operable as a display.

According to various, but not necessarily all, embodiments of the invention there is provided a method comprising: providing one or more carbon nanotubes and one or more fullerenes directly covalently bonded to the one or more carbon nanotubes; and bonding one or more photoactive molecules to the one or more fullerenes.

The method may further comprise providing one or more $sp^2$ bonds directly between a carbon atom of the one or more fullerenes and a carbon atom of the carbon nanotube.

The one or more photoactive molecules may be covalently bonded to the one or more fullerenes.

The method may further comprise configuring the one or more photoactive molecules such that reception of a photon causes an electron to move to the one or more fullerenes.

The method may further comprise configuring the one or more photoactive molecules such that reception of a photon causes the one or more photoactive molecules to change configuration.

The method may further comprise providing molecules configured to provide electrons to the one or more photoactive molecules.

According to various, but not necessarily all, embodiments of the invention there is provided a method comprising: providing a first electrode and a second electrode; providing a photoactive member including apparatus as described in any of the above paragraphs, the photoactive member being coupled to the first electrode and to the second electrode.

The first electrode and/or the second electrode may comprise one or more nanotubes and one or more fullerenes directly covalently bonded to the one or more carbon nanotubes.

The density of carbon nanotubes in the photoactive member may be greater than the percolation threshold of semiconducting nanotubes and less than the percolation threshold of metallic carbon nanotubes, or the density of carbon nanotubes in the photoactive member may be greater than the percolation threshold of metallic carbon nanotubes. The device may be operable as a photo sensor.

The density of carbon nanotubes in the photoactive member may be less than the percolation threshold of semiconducting nanotubes, or may be greater than the percolation threshold of semiconducting nanotubes and less than the percolation threshold of metallic carbon nanotubes, or may be greater than the percolation threshold of metallic carbon nanotubes. The device may be operable as a photovoltaic cell.

The method may further comprise providing an electrical energy storage device coupled to the first and second electrodes and configured to receive electrical energy from the photoactive member.

The method may further comprise providing a plurality of first and second electrodes and a plurality of photoactive members to form an imaging device.

A first portion of the photoactive members may be configured to detect photons having frequencies in a first frequency band, and a second portion of the photoactive members may be configured to detect photons having frequencies in a second frequency band.

Each photoactive member may be configured to detect photons having frequencies in a frequency band, and the imaging device may further comprise one or more filters configured to filter photons having frequencies in frequency bands that are a subset of the frequency band.

The first and second electrodes may be configured to receive electrical energy and provide the electrical energy to the photoactive member. The device may be operable as a display.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

In the following description, the wording 'connect' and 'couple' and their derivatives mean operationally connected/coupled. It should be appreciated that any number or combination of intervening components can exist (including no intervening components).

Figure 1:
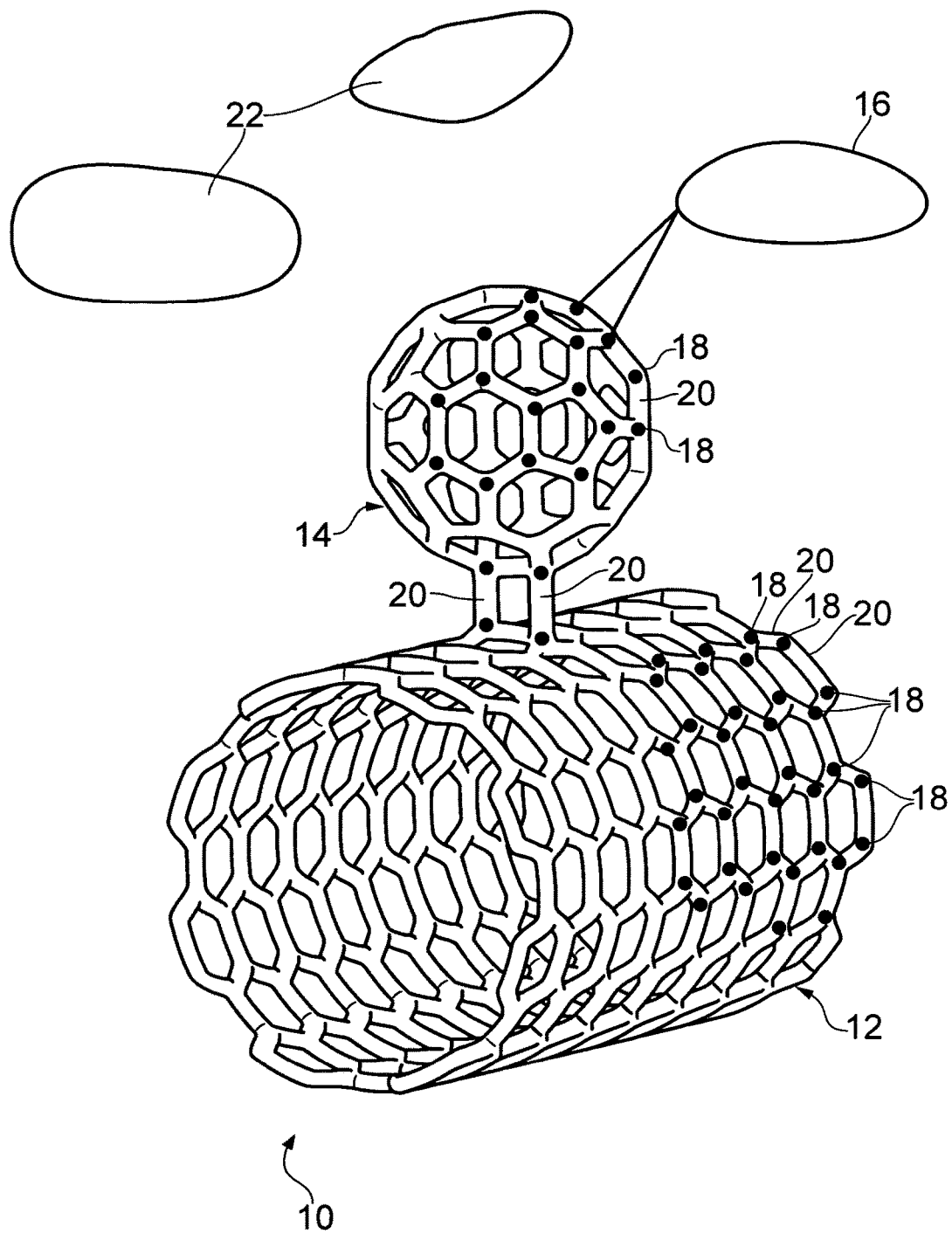
FIG. 1 illustrates a schematic diagram of apparatus according to various embodiments of the invention.

FIG. 1 illustrates a schematic diagram of apparatus 10 including a carbon nanotube 12, a fullerene 14 and a photoactive molecule 16. As described in greater detail in the following paragraphs, the apparatus 10 may be configured to provide an output current in response to receiving incident photons and/or be configured to provide photons in response to receiving an input current. The apparatus 10 may be incorporated into a variety of devices (such as a light sensor, a photovoltaic cell, an imaging device or a display for example) and provide, at least in part, a photoactive portion for receiving and/or providing photons. The apparatus 10 may be integrated within a device or may be a module for such a device. As used here 'module' refers to a unit or apparatus that excludes certain parts/components that would be added by an end manufacturer or a user.

The carbon nanotube 12 comprises a plurality of carbon atoms 18 (a portion of which are illustrated for exemplary purposes), covalently bonded together (via $sp^2$ bonds 20), to form a substantially hollow cylindrical structure. The carbon nanotube 12 may be a single-walled nanotube (SWNT) (that is, the cylindrical structure comprises a single layer of carbon atoms) or may be a multi-walled nanotube (MWNT) (that is, the cylindrical structure comprises a plurality of layers of carbon atoms). The carbon nanotube 12 may have any suitable dimensions and may have a diameter of up to a few nanometers and a length of up to a few millimeters.

It should be understood that the apparatus 10 may include any number of carbon nanotubes 12 and that FIG. 1 illustrates a single carbon nanotube 12 to maintain the clarity of the figure.

The fullerene 14 comprises a plurality of carbon atoms 18 (a portion of which are illustrated for exemplary purposes), covalently bonded together (via $sp^2$ bonds), to form a structure. The fullerene 14 may have any suitable shape and may form a hollow sphere, a hollow ellipsoid or a hollow tube for example. Furthermore, the fullerene 14 may comprise any number of carbon atoms and may comprise, for example, sixty carbon atoms and form a 'buckyball'.

The fullerene 14 is directly covalently bonded to the carbon nanotube 12 (that is, there are no intervening atoms or molecules in the bond between the carbon nanotube 12 and the fullerene 14). The fullerene 14 may be covalently bonded to the carbon nanotube 12 via one or more $sp^2$ bonds 20 and in the exemplary embodiment illustrated in FIG. 1, the fullerene 14 is directly covalently bonded to the carbon nanotube 12 via two $sp^2$ bonds.

The combination of the carbon nanotube 12 and the fullerene 14 form a carbon nanobud structure. It should be appreciated that any number of fullerenes 14 may be directly covalently bonded to the carbon nanotube 12.

The photoactive molecule 16 is bonded to the fullerene 14 and may be bonded via one or more covalent bonds or via non-covalent bonding (ionic bonding for example). Hence, the fullerene 14 is functionalized by the photoactive molecule 16. The photoactive molecule 16 may be any suitable photoactive molecule that enables the detection and/or emission of a photon at the apparatus 10.

The photoactive molecule 16 may be configured such that absorption of a photon by the photoactive molecule 16 causes an electron to move from the photoactive molecule 16 to the fullerene 14 and subsequently to the carbon nanotube 12. For example, the photoactive molecule 16 may be a porphyrin molecule and may be a metalloporphyrin (MP). Examples of metalloporphyrins include zinc porphyrin (ZnP), tin porphyrin (SnP), manganese porphyrin (MnP), cobalt porphyrin (CoP), nickel porphyrin (NiP), copper porphyrin (CuP) and iron porphyrin (FeP).

In other embodiments, the photoactive molecule 16 may be configured such that reception of a photon by the photoactive molecule 16 causes the photoactive molecule 16 to change configuration. For example, the photoactive molecule 16 may change configuration by changing from a first ordering of atoms to a second ordering of atoms. The photoactive molecule 16 may be a chromophore such as azobenzene and be configured to isomerize from a ground state trans configuration to an excited state cis configuration upon absorption of a photon. The change from the ground state trans configuration to the excited state cis configuration results in a change in the dipole moment of the photoactive molecule 16. The change in the configuration of the photoactive molecule 16 may result in a change in electrostatic potential across the carbon nanotube 12.

It should be appreciated that in some embodiments, a single photoactive molecule 16 may be bonded to the fullerene 14 and in other embodiments, a plurality of photoactive molecules 16 may be bonded to the fullerene 14. In addition to bonding to fullerenes, the photoactive molecules 16 can also be bonded to the carbon nanotube 12.

In various embodiments of the invention, one or more photoactive molecules 16 may be bonded to 'antenna like' dendrimer structures that increase the flow of electrons to the fullerene 14. The dendrimer structures may comprise any suitable porphyrin molecules. For example, the fullerene 14, photoactive molecule 16 and the dendrimer structure may be $(ZnP)_3$—ZnP—$H_2P$—$C_{60}$.

In some embodiments of the present invention, the apparatus 10 also includes a plurality of molecules 22 that are configured to provide electrons to the one or more photoactive molecules 16. Consequently, the molecules 22 may also be referred to as 'electron donor' molecules. The plurality of molecules 22 may form, for example, a polymer, solvent or gel. The molecules 22 may comprise conjugated polymer poly(3-hexyl-thiophene) (P3HT) for example.

Embodiments of the present invention may provide several advantages. The direct covalent bonding between the fullerene 14 and the carbon nanotube 12 may be highly conductive and the apparatus 10 may advantageously provide a material with relatively high efficiency and high sensitivity when used for detecting and/or emitting photons. Furthermore, the direct covalent bonding between the fullerene 14 and the carbon nanotube 12 may result in the apparatus 10 having relatively high chemical and physical stability. Furthermore, the bonding between the fullerene 14 and the photoactive molecule 16 may be more robust and easier to achieve than the bonding between a photoactive molecule 16 and the carbon nanotube 12 without covalently bonded fullerenes.

Figure 2:
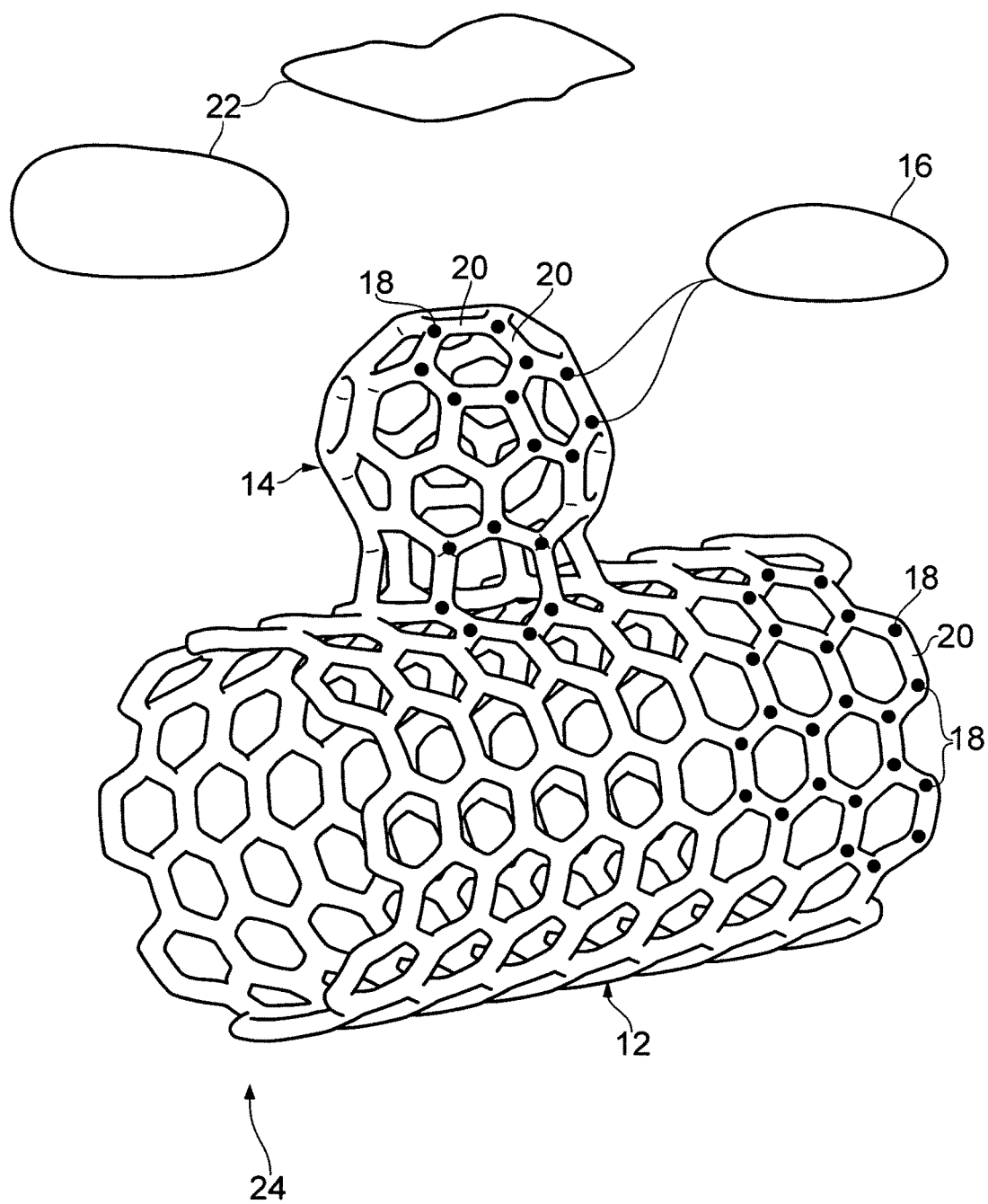
FIG. 2 illustrates a schematic diagram of another apparatus according to various embodiments of the invention.

FIG. 2 illustrates a schematic diagram of another apparatus 24 according to various embodiments of the invention. The apparatus 24 is similar to the apparatus 10 illustrated in FIG. 1 and where the features are similar, the same reference numerals are used. The apparatus 24 differs from the apparatus 10 in that the fullerene 14 is directly covalently bonded to the carbon nanotube 12 via six $sp^2$ bonds instead of two $sp^2$ bonds.

Figure 3:
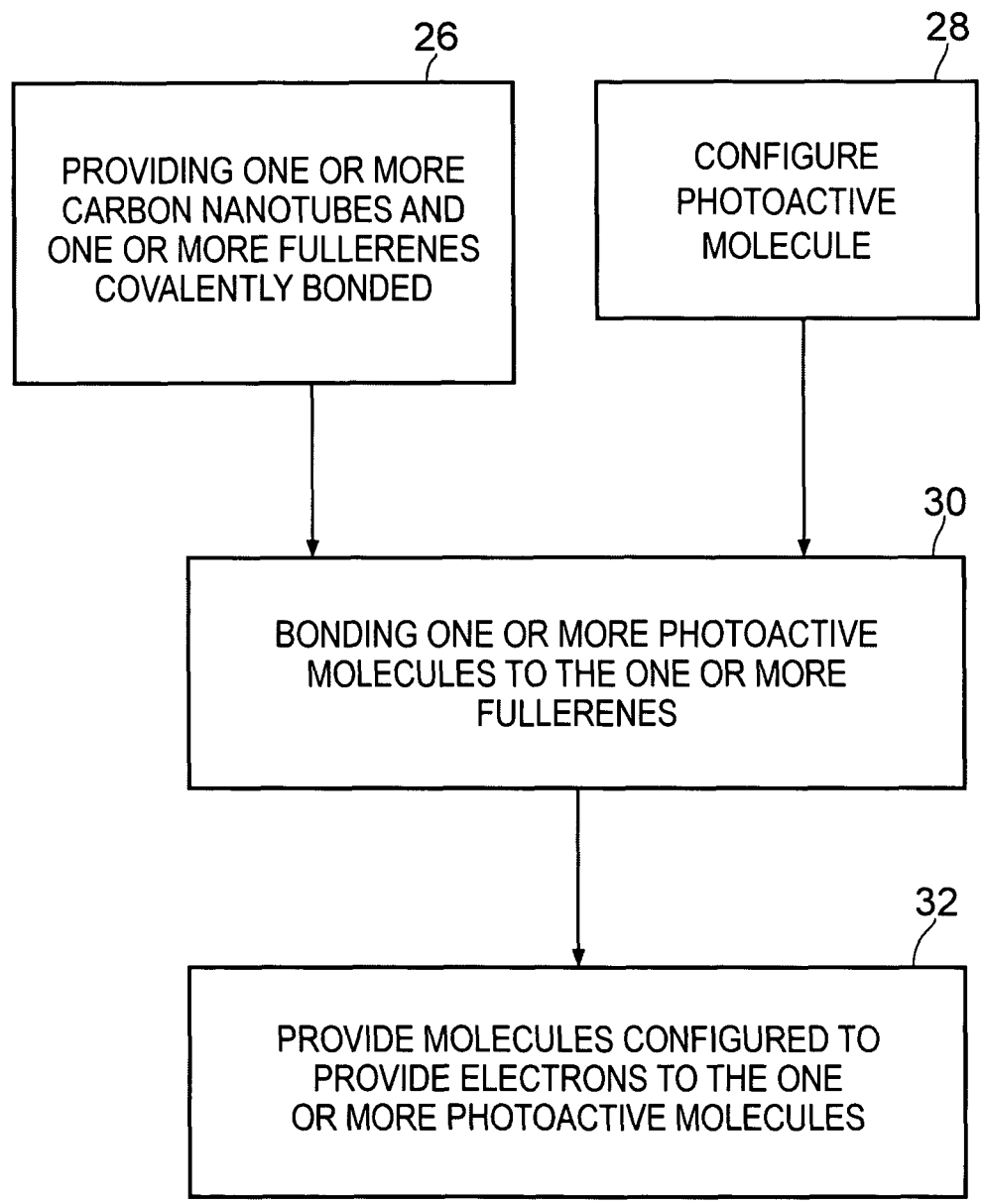
FIG. 3 illustrates a flow diagram of a method for manufacturing apparatus according to various embodiments of the invention.

FIG. 3 illustrates a flow diagram of a method for manufacturing an apparatus according to various embodiments of the invention. At block 26, the method includes providing one or more carbon nanotubes 12 and one or more fullerenes 14 that are directly covalently bonded (that is, one or more nanobuds) as described in the preceding paragraphs. The method for providing a plurality of nanobuds in well known in the art of nanotechnology and will not be described in detail here. In brief, one method for providing a plurality of nanobuds includes obtaining aerosolized or substrate supported catalyst particles from a catalyst particle source (ferrocene for example). The catalyst particles are then placed in a reactor with one or more carbon sources (carbon monoxide for example) and one or more reagents (water vapor and/or carbon dioxide for example) and then heated (up to 1150 degrees Celsius for example). The carbon source catalytically decomposes on the surface of the catalyst particles together with the reagents to form the plurality of nanobuds.

At block 28, the method includes configuring/synthesizing one or more photoactive molecules 16. The photoactive molecules 16 may be configured/synthesized such that reception of a photon causes an electron to move to the one or more fullerenes as described above. Alternatively, the photoactive molecules 16 may be configured/synthesized such that reception of a photon causes the one or more photoactive molecules to change configuration as described above.

At block 30, the method includes bonding one or more photoactive molecules 16 to the one or more fullerenes. The photoactive molecules may be covalently bonded to the fullerenes or may be non-covalently bonded to the fullerenes. For example, zinc porphyrin aldehyde may be bonded to the nanobuds formed in block 26 by refluxing in the presence of N-methylglycine for three days in toluene.

At block 32, the method includes providing molecules 22 that are configured to provide electrons to the one or more photoactive molecules. For example, the carbon nanotubes from block 30 may be added to a polymer, solvent or a gel. In various embodiments, the carbon nanotubes from block 30 may be added to conjugated polymer poly(3-hexyl-thiophene) (P3HT).

The method described above with reference to FIG. 3 may provide several advantages. One such advantage is that the method provides a relatively simple manufacturing process since the carbon nanotubes 12 and the fullerenes 14 are formed together in block 26 as a nanobud structure. Consequently, the manufacturing process may be relatively low cost.

Figure 4:
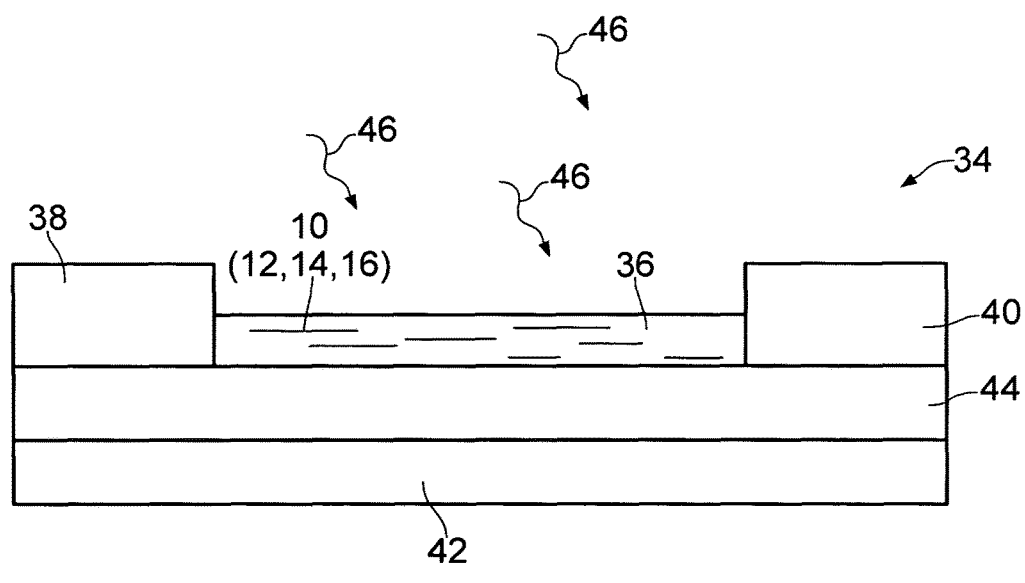
FIG. 4 illustrates a schematic diagram of a device according to various embodiments of the invention.

FIG. 4 illustrates schematic cross sectional diagram of a device 34 according to various embodiments of the invention. The device 34 includes a photoactive member 36, a first electrode 38, a second electrode 40, a third electrode 42 and a substrate 44. As described in detail in the following paragraphs, the device 34 is configured to detect incident photons and may consequently function as a photo (light) sensor. The device 34 may be integrated in another device (a portable communication device such as a mobile telephone for example) or may be a module for such devices.

The photoactive member 36 comprises apparatus 10, 24 as described in the preceding paragraphs (that is, the photoactive member 36 comprises a nanobud network). The nanobud network may be ordered or random. Where the nanobud network is random, the nanobud network may be directly deposited (to a substrate for example) after synthesis.

The photoactive member 36 may also comprise a solution or a polymer matrix in which the apparatus 10, 24 may be embedded or mixed. Consequently, the photoactive member 36 may comprise two or more component materials (including the apparatus 10, 24) with different morphologies.

During manufacture, the carbon nanotubes 12 in the photoactive member 36 are disposed to form the network such that the density of the network is below the "percolation threshold" (also referred to as percolation density—$\rho_c$) of metallic carbon nanotubes but above the percolation threshold of semiconducting carbon nanotubes. Hence, the photoactive member 36 functions as a semiconductor. The photoactive member 36 may be coated with any suitable transparent substance to protect the photoactive member 36 from the environment and from damage caused by a user of the device (scratches for example).

For a given network, the percolation threshold is the point at which the network achieves long range connectivity. This means that when a network is at its percolation threshold, there is at least one path along which it is possible to smoothly travel from one side of the network to the other, thus providing long range connectivity in the network. Below this threshold there is typically only short range connectivity, in that there are only short paths that can be taken. These short paths do not provide a route from one side of the network to the other. Above this threshold, more paths/routes from one side of the network to the other occur, such that there are multiple routes that can be taken.

The connectivity of the network is determined by a number of factors:
1. path length—for a particular network density, the longer each average path length is (relative to the size of the network), the closer the network will be to the percolation threshold;
2. network density—for a particular average path length, the more paths there are per unit volume, the closer the network will be to the percolation threshold.

These factors are dependent on one another. The shorter the average path length, the higher the network density needs to be to ensure that the short paths form at least one long range connected route across the network.

Similarly, the lower the network density, the longer the paths need to be in order to ensure that there is at least one long range connected route across the network.

In this particular case, the percolation threshold represents the density transition point from which the system can be seen to move from a network of substantially individual carbon nanotubes, to a single connected large cluster to which nearly all of the carbon nanotubes belong. Well above this threshold, the network becomes thick and very dense. For example, for a square sample of side length L, and carbon nanotubes of length l, the percolation density ρc is given by the formula:

$$\rho c = N/(L/l)2 = 5.6 \pm 0.1$$

Therefore, the threshold number of carbon nanotubes is:

$$N = 5.6 \times (L/l)2$$

This value naturally changes when the system is not a square, but, for example, a rectangle or a circle. Also, as stated above, the length of the nanotubes as well as the length distribution of the carbon nanotubes affects the threshold.

In many applications, it would be advantageous to configure the nanobud network such that it is substantially at the percolation threshold. By the network being "substantially at the percolation threshold", it is meant that the network density and/or nanotube lengths are such that the network is either at the percolation threshold, or slightly above it. For example, this could be by 0.01%, 0.1%, 1%, 2%, 3%, 4%, 5%, 10%, 15%, 25%, 50%, 100% or even 200% above the percolation threshold, or any combination of ranges therebetween. It should be noted that the long range connectivity effects that begin to occur at the percolation threshold can still be present in the network even when the network is at a value that is up to three times the percolation threshold value (that is, 200% above it). Also, variations between manufactured devices, or variations between one part/region of a device to another, can decrease the further the network is from the percolation threshold. This is at least partly due to the number of possible long range connective paths increasing as the density of the network increases.

In general, when manufactured, ⅓ of carbon nanotubes turn out to be metallic and ⅔ semiconducting. Therefore it is possible to define percolation thresholds for metallic and semiconducting nanotubes separately.

The first electrode 38, the second electrode 40 and the third electrode 42 are coupled to the photoactive member 36. In this embodiment, the first and second electrodes 38, 40 are in direct contact with the photoactive member 36 and the third electrode 42 is coupled to the photoactive member 36 via the substrate 44. The first, second and third electrodes 38, 40 may comprise any suitable conductive material and may comprise a network of nanobuds for example (with a density above the metallic percolation threshold). The first and second electrodes 38, 40 may be connected to a controller which is configured to determine when photons are absorbed by the photoactive member 36.

The substrate 44 may be any suitable substrate for supporting the photoactive member 36, the first electrode 38, the second electrode 40 and the third electrode 42. The substrate 44 may be substantially rigid or may be substantially flexible.

It should be appreciated that the device 34 forms a transistor where the first electrode 38 forms a source terminal, the second electrode 40 forms a drain terminal and the third electrode 42 forms a gate terminal.

In another embodiment of the device 34, the density of carbon nanotubes 12 in the photoactive member 36 is greater than the percolation threshold of metallic carbon nanotubes and hence, the photoactive member 36 functions as a conductor.

The first electrode 38 and the second electrode 40 are coupled to the photoactive member 36. In this embodiment, the first and second electrodes 38, 40 are in direct contact with the photoactive member 36. The first and second electrodes 38, 40 may comprise any suitable conductive material and may comprise a network of nanobuds for example (with a density above the metallic percolation threshold). The first and second electrodes 38, 40 may be connected to a controller which is configured to determine when photons are absorbed by the photoactive member 36.

It should be appreciated that the device 34 forms a conducting channel where the first electrode 38 forms a source terminal, the second electrode 40 forms a drain terminal.

In operation, the absorption of photons by the photoactive member 36 results in an increase in the output current from the second electrode 40. The increase in output current and hence detection of incident photons (light for example) may be received and determined by the controller (a processor or an application specific integrated circuit (ASIC) for example). In some embodiments, a voltage is applied across the first electrode 38 and the second electrode 40 which causes electrons (transferred by the absorption of photons) to flow from the photoactive molecules 16 to the carbon nanotubes 12 (via the fullerenes 14) and subsequently to the second electrode 40. In other embodiments, the absorption of photons changes the resistivity of the photoactive member 36 which may be detected by passing a current through the device 34. The third electrode 42 may be configured/tuned to determine the sensitivity of the device 34.

Figures 5A, 5B:
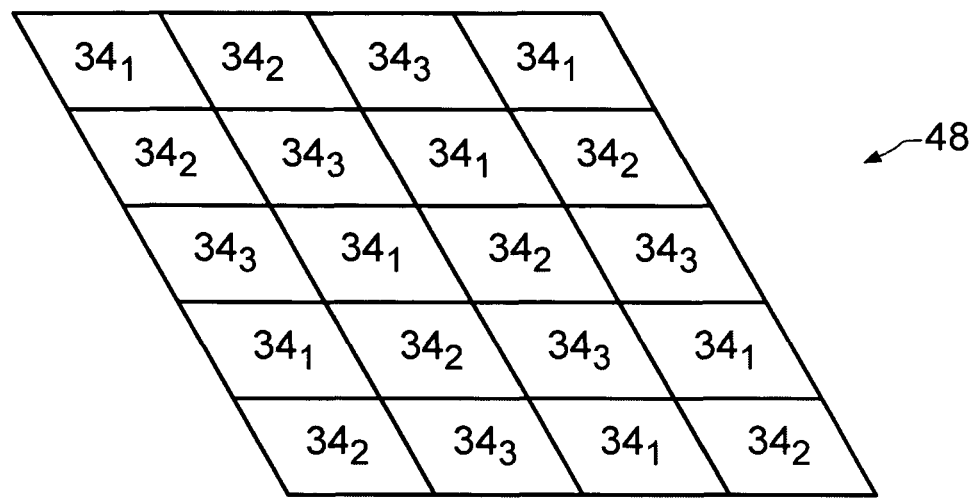
FIG. 5A illustrates a schematic perspective view of another device according to various embodiments of the invention.
FIG. 5B illustrates a cross sectional diagram of a further device according to various embodiments of the invention.

FIG. 5A illustrates a schematic perspective view of another device 48 according to various embodiments of the invention. The device 48 is configured to function as an imaging device (a sensor area of a camera for example) and includes a plurality of devices (light sensors) 34 arranged in an N by M matrix. In FIG. 5A, the plurality of devices 34 are arranged in a four by five matrix for exemplary purposes and it should be appreciated that the matrix may include a greater number of devices.

The plurality of devices 34 includes a first subset of devices $34_1$, a second subset of devices $34_2$ and a third subset of devices $34_3$. The devices 34 are arranged so that each 3 by 3 matrix includes three devices from the first subset of devices $34_1$, three devices from the second subset of devices $34_2$ and three devices from the third subset of devices $34_3$.

The photoactive members 36 of the first subset of devices $34_1$ are configured to provide an increase in output current in response to absorbing photons having frequencies in a first frequency band (with wavelengths between 400 nm to 500 nm for example). The photoactive members 36 of the second subset of devices $34_2$ are configured to provide an increase in output current in response to absorbing photons having frequencies in a second frequency band (with wavelengths between 500 nm to 600 nm for example). The photoactive members 36 of the third subset of devices $34_3$ are configured to provide an increase in output current in response to absorbing photons having frequencies in a third frequency band (with wavelengths between 600 nm to 700 nm for example). Consequently, the imaging device 48 is advantageously configured to absorb photons across the spectrum of visible light and determine particular colors by utilizing photoactive members 36 that are configured to absorb photons in different frequency bands.

FIG. 5B illustrates a schematic cross sectional view of a further device 50 according to various embodiments of the invention. The device 50 is configured to function as an imaging device (a sensor area of a camera for example) and includes a plurality of devices (light sensors) 34 arranged in an N by M matrix, and a plurality of filters 52 that correspondingly overlay (as a matrix) the plurality of devices 34. In FIG. 5B, the plurality of devices 34 and the plurality of filters 52 are arranged in four columns for exemplary purposes and it should be appreciated that the matrix may include a greater number of devices and filters.

The photoactive members 36 of the plurality of devices 34 are configured to provide an increase in output current in response to absorbing photons having frequencies in a frequency band (with wavelength of 400 nm to 700 nm for example).

The plurality of filters 52 includes a first subset of filters $52_1$, a second subset of filters $52_2$ and a third subset of filters $52_3$. The filters 52 are arranged so that each 3 by 3 matrix includes three filters from the first subset of filters $52_1$, three filters from the second subset of filters $52_2$ and three filters from the third subset of filters $52_3$.

The filters of the first subset of filters $52_1$ are configured to filter photons having frequencies outside a first frequency band (with wavelengths between 400 nm to 500 nm for example). The filters of the second subset of filters $52_2$ are configured to filter photons having frequencies outside a second frequency band (with wavelengths between 500 nm to 600 nm for example). The filters of the third subset of filters $52_3$ are configured to filter photons having frequencies outside a third frequency band (with wavelengths between 600 nm to 700 nm for example). Consequently, the imaging device 48 is advantageously configured to absorb photons and determine particular colors across the spectrum of visible light by utilizing filters 52 that are configured to filter photons in different frequency bands.

Figure 6:
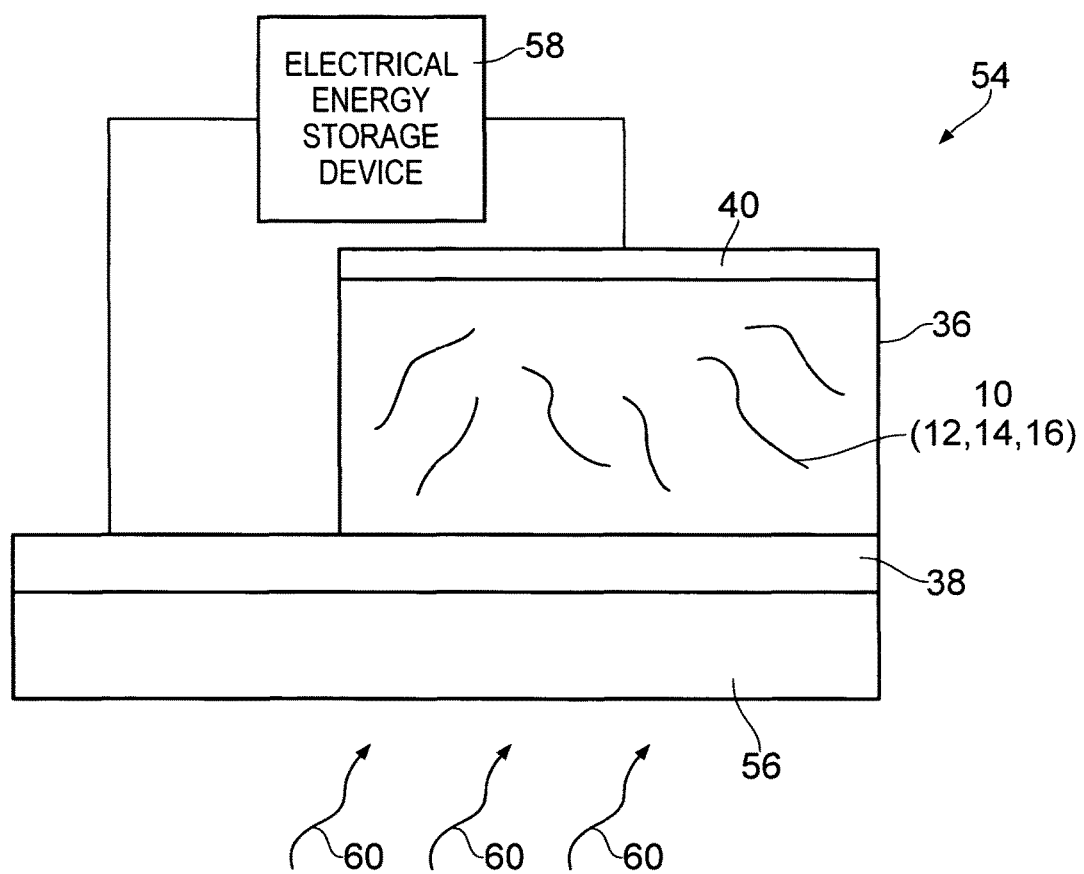
FIG. 6 illustrates a schematic diagram of another device according to various embodiments of the invention.

FIG. 6 illustrates a schematic diagram of another device 54 according to various embodiments of the invention. The device 54 is similar to the device 34 illustrated in FIG. 4 and where the features are similar, the same reference numerals are used. The device 54 includes a photoactive member 36, a first electrode 38, a second electrode 40, and a substrate 56 and an electrical energy storage device 58. As described in detail in the following paragraphs, the device 54 is configured to receive photons and convert and store the photons as electrical energy. The device 54 may consequently function as a photovoltaic cell. The device 34 may be integrated in another device (a portable communication device such as a mobile telephone for example) or may be a module for such devices.

The photoactive member 36 is configured to provide an increase in output current in response to absorbing photons 60 having frequencies in a frequency band (with wavelengths of 400 nm to 700 nm for example). The photoactive member 36 is configured to function as a dielectric and in various embodiments, the density of carbon nanotubes 12 in the photoactive member 36 is below the percolation threshold of semiconducting nanotubes. In other embodiments, the density of carbon nanotubes 12 may be greater than the percolation threshold of semiconducting nanotubes (and may be greater than the percolation threshold of metallic nanotubes) and an electron donating layer in the photoactive member 36 may be a dielectric. In these embodiments, photoelectric conversion may occur in the interface between the carbon nanobud network and the electron donating layer and electrons are relatively free to travel in the carbon nanobud network part.

The first electrode 38 and the substrate 56 are substantially transparent to the photons 60 and enable the photons 60 to pass to the photoactive member 36. The first electrode 38 may comprise indium tin oxide (ITO) or conducting carbon nanotube network, and the substrate 56 may comprise glass or transparent plastic.

The electrical energy storage device 58 is connected to the first electrode 38 and to the second electrode 40 and is configured to store the electrical energy generated by the photoactive member 36. The electrical energy storage device 58 may be any suitable device and may be, for example, one or more electrochemical cells.

In some embodiments, the device 54 may not include an electrical energy storage device and the electrical energy generated by the photoactive member 36 may be provided instead to an electronic component to power the electronic component. For example, the electrical energy generated by the photoactive member 36 may be provided to a sensor or a radio frequency identification (RFID) component for example.

In various embodiments of the present invention, the photoactive member 36 may be configured so that the photoactive molecules 16 are configured to emit photons in response to receiving an applied voltage/current. In these embodiments, the device 54 may comprise a plurality of photoactive members 36 and function as a display that receives electrical energy from the electrical energy storage device 58.

In various embodiments of the invention, the photoactive member 36 may be configured so that the photoactive molecules 16 may both emit and absorb photons. In these embodiments, the device 54 may function as a photovoltaic cell and as a display. Advantageously, the device 54 may store electrical energy generated by the photoactive member 36 and then use the stored electrical energy to emit photons.

Figure 7:
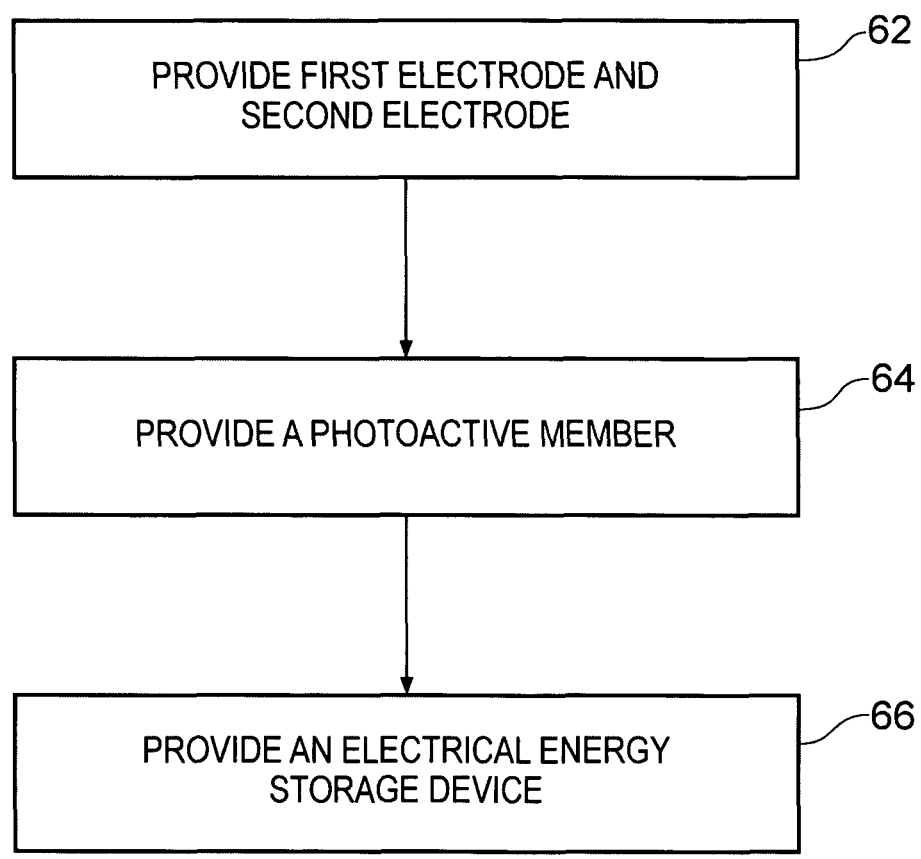
FIG. 7 illustrates a flow diagram of a method for manufacturing a device according to various embodiments of the invention.

FIG. 7 illustrates a flow diagram of a method for manufacturing a device 34, 48, 50, 54 according to various embodiments of the invention. At block 62, the method includes providing the first electrode 38, the second electrode 40 and optionally, the third electrode 42.

At block 64, the method includes providing the photoactive member 36 and coupling the photoactive member 36 to at least the first electrode 38 and to the second electrode 40. The photoactive member 36 may be fabricated (or the carbon nanotubes 12 may be separated after manufacture) so that the density of carbon nanotubes 12 throughout the photoactive member 36 is suitable for a particular use. For example, the photoactive member 36 may be fabricated for use in a transistor so that the density of carbon nanotubes 12 is greater than the percolation threshold of semiconducting nanotubes and less than the percolation threshold of metallic carbon nanotubes. By way of a further example, the photoactive member 36 may be fabricated for use in photo sensor or a photovoltaic cell so that the density of carbon nanotubes 12 is greater than the percolation threshold of metallic carbon nanotubes.

At (optional) block 66, the method includes providing the electrical energy storage device 58 and connecting the electrical energy storage device to the first electrode 38 and to the second electrode 40.

Embodiments of the present invention provide an advantage in that the photoactive member 36 (comprising apparatus 10) may be relatively easily integrated into other carbon nanotube electronics in a device (the electrodes 38, 40 for example).

The blocks illustrated in the FIGS. 3 and 7 may represent steps in a method and/or sections of code in a computer program. For example, the methods of FIGS. 3 and 7 may be carried out by machinery that is controlled by a processor executing the computer program. The illustration of a particular order to the blocks does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
one or more carbon nanotubes;
one or more fullerenes directly covalently bonded to the one or more carbon nanotubes;
one or more photoactive molecules bonded to the one or more fullerenes, wherein the one or more photoactive molecules are configured such that reception of a photon causes the one or more photoactive molecules to change configuration, wherein the one or more photoactive molecules are configured to isomerize from a ground state configuration to an excited state configuration upon absorption of the photon, and wherein the one or more photoactive molecules are bonded to dendrimer structures, wherein the dendrimer structures are configured to increase the flow of electrons to the one ore more fullerenes; and
one or more $sp^2$ bonds directly between a carbon atom of the one or more fullerenes and a carbon atom of the one or more carbon nanotubes;
wherein the one or more fullerenes are functionalized by the one or more photoactive molecules; and
wherein the one or more carbon nanotubes, the one or more fullerenes, and the one or more photoactive molecules form a photoactive member, wherein the photoactive member is between a first electrode and a second electrode, wherein a substrate is between the first electrode and a third electrode, wherein the substrate is between the second electrode and the third electrode, wherein the first and second electrodes are in direct contact with the photoactive member, wherein the substrate comprises a first side and an opposite second side, wherein the substrate directly supports the first and second electrodes on the first side, wherein the substrate directly supports the third electrode on the second side, wherein the first electrode comprises a source terminal, wherein the second electrode comprises a drain terminal, and wherein the third electrode comprises a gate terminal.

2. The apparatus as claimed in claim 1, wherein the one or more photoactive molecules are covalently bonded to the one or more fullerenes.

3. An apparatus comprising:
one or more carbon nanotubes;
one or more fullerenes directly covalently bonded to the one or more carbon nanotubes;
one or more photoactive molecules bonded to the one or more fullerenes, wherein the one or more photoactive molecules are configured such that reception of a photon causes an electron to move to the one or more fullerenes, wherein the one or more photoactive molecules are configured to isomerize from a ground state configuration to an excited state configuration upon absorption of the photon, and wherein the one or more photoactive molecules are bonded to dendrimer structures, wherein the dendrimer structures are configured to increase the flow of electrons to the one ore more fullerenes; and
one or more $sp^2$ bonds directly between a carbon atom of the one or more fullerenes and a carbon atom of the one or more carbon nanotubes;
wherein the one or more fullerenes are functionalized by the one or more photoactive molecules; and
wherein the one or more carbon nanotubes, the one or more fullerenes, and the one or more photoactive molecules form a photoactive member, wherein the photoactive member is between a first electrode and a second electrode, wherein a substrate is between the first electrode and a third electrode, and wherein the substrate is between the second electrode and the third electrode, wherein the first and second electrodes are in direct contact with the photoactive member, wherein the substrate comprises a first side and an opposite second side, wherein the substrate directly supports the first and second electrodes on the first side, wherein the substrate directly supports the third electrode on the second side, wherein the first electrode comprises a source terminal, wherein the second electrode comprises a drain terminal, and wherein the third electrode comprises a gate terminal.

4. The apparatus as claimed in claim 1, further comprising molecules configured to provide electrons to the one or more photoactive molecules.

5. The apparatus as claimed in claim 1, wherein the first electrode and/or the second electrode comprise one or more additional carbon nanotubes and one or more additional fullerenes directly covalently bonded to the one or more additional carbon nanotubes.

6. The apparatus as claimed in claim 1, wherein the density of carbon nanotubes in the photoactive member is greater than the percolation threshold of semiconducting nanotubes and less than the percolation threshold of metallic carbon nanotubes, or the density of carbon nanotubes in the photoactive member is greater than the percolation threshold of metallic carbon nanotubes, and the device is operable as a photo sensor.

7. A method comprising:
providing one or more carbon nanotubes and one or more fullerenes directly covalently bonded to the one or more carbon nanotubes;
bonding one or more photoactive molecules to the one or more fullerenes, wherein the one or more photoactive molecules are configured such that reception of a photon causes the one or more photoactive molecules to change configuration, wherein the one or more photoactive molecules are configured to isomerize from a ground state configuration to an excited state configuration upon absorption of the photon, and wherein the one or more photoactive molecules are bonded to dendrimer structures, wherein the dendrimer structures are configured to increase the flow of electrons to the one or more fullerenes; and
providing one or more $sp^2$ bonds directly between a carbon atom of the one or more fullerenes and a carbon atom of the one or more carbon nanotubes;
wherein the one or more fullerenes are functionalized by the one or more photoactive molecules; and
wherein the one or more carbon nanotubes, the one or more fullerenes, and the one or more photoactive molecules form a photoactive member, wherein the photoactive member is between a first electrode and a second electrode, wherein a substrate is between the first electrode and a third electrode, and wherein the substrate is between the second electrode and the third electrode, wherein the first and second electrodes are in direct contact with the photoactive member, wherein the substrate comprises a first side and an opposite second side, wherein the substrate directly supports the first and second electrodes on the first side, wherein the substrate directly supports the third electrode on the second side, wherein the first electrode comprises a source terminal, wherein the second electrode comprises a drain terminal, and wherein the third electrode comprises a gate terminal.

8. The method as claimed in claim 7, wherein the one or more photoactive molecules are covalently bonded to the one or more fullerenes.

9. A method comprising:
providing the apparatus as claimed in claim 1, the photoactive member being coupled to the first electrode and to the second electrode.

10. The method as claimed in claim 9, wherein the first electrode and/or the second electrode comprise one or more additional carbon nanotubes and one or more additional fullerenes directly covalently bonded to the one or more additional carbon nanotubes.

11. The apparatus as claimed in claim 1, wherein the change from the ground state configuration to the excited state configuration provides for a change in the dipole moment of the one or more photoactive molecules.

12. The apparatus as claimed in claim 1, wherein the change in the configuration of the one or more photoactive molecules provides for a change in electrostatic potential across the one or more carbon nanotubes.

13. The apparatus as claimed in claim 1, wherein the dendrimer structures comprise porphyrin molecules.

* * * * *

UNITED STATES PATENT AND TRADEMARK OFFICE
CERTIFICATE OF CORRECTION

PATENT NO. : 10,177,314 B2
APPLICATION NO. : 12/630206
DATED : January 8, 2019
INVENTOR(S) : Pirjo Pasanen et al.

Page 1 of 1

It is certified that error appears in the above-identified patent and that said Letters Patent is hereby corrected as shown below:

On the Title Page

Should Read:
18 Claims, 7 Drawings Sheets.

In the Claims

In Claim 1:
Column 12, Line 12, "ore" should be deleted and --or-- should be inserted.

In Claim 3:
Column 12, Line 52, "ore" should be deleted and --or-- should be inserted.

Signed and Sealed this
Fifth Day of March, 2019

Andrei Iancu
*Director of the United States Patent and Trademark Office*